United States Patent [19]

McElroy

[11] 4,393,474
[45] Jul. 12, 1983

[54] EPROM AND RAM CELL LAYOUT WITH EQUAL PITCH FOR USE IN FAULT TOLERANT MEMORY DEVICE OR THE LIKE

[75] Inventor: David J. McElroy, Houston, Tex.

[73] Assignee: Texas Instruments Incorporated, Dallas, Tex.

[21] Appl. No.: 120,429

[22] Filed: Feb. 11, 1980

Related U.S. Application Data

[63] Continuation of Ser. No. 88,709, Oct. 26, 1979.

[51] Int. Cl.³ .............................................. G11C 11/40
[52] U.S. Cl. .................................. 365/200; 365/210; 371/10
[58] Field of Search ................... 365/200, 210; 371/10

[56] References Cited

U.S. PATENT DOCUMENTS 3,765,001 10/1973 Beausoleil ........................ 365/200

Primary Examiner—Terrell W. Fears
Attorney, Agent, or Firm—John G. Graham

[57] ABSTRACT

A fault tolerant memory device includes an array of rows and columns of dynamic random access memory cells and a set of EPROM cells of the floating gate type laid out with the same pitch, one aligned with each row, to store the identity of rows having bad cells. The EPROM cells are formed in preferred manner which permits them to be made with a standard N-channel process, and allows the row lines of the RAM and control gate connections to the EPROM cells to be of the same spacing.

12 Claims, 33 Drawing Figures

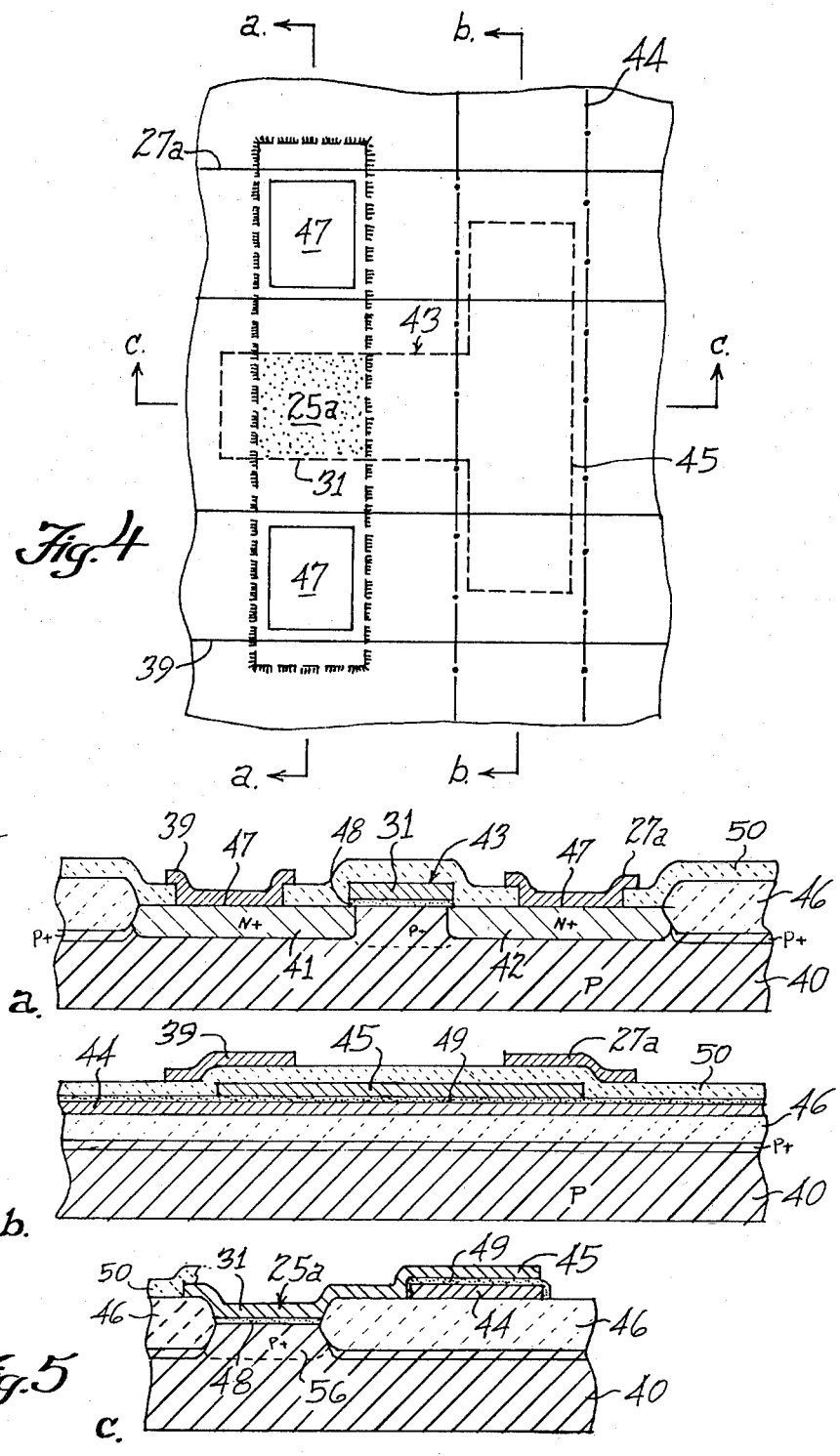

EPROM AND RAM CELL LAYOUT WITH EQUAL PITCH FOR USE IN FAULT TOLERANT MEMORY DEVICE OR THE LIKE

RELATED CASES

This application is in part a continuation of my prior co-pending application Ser. No. 088,709, filed Oct. 26, 1979, and discloses subject matter contained in co-pending application Ser. No. 095,754, filed Nov. 19, 1979, by McAlexander and White, both applications assigned to Texas Instruments.

BACKGROUND OF THE INVENTION

This invention relates to semiconductor devices, and more particularly to an electrically programmable memory cell of the floating gate type which is especially adapted for use in a fault-tolerant dynamic RAM.

As the bit density increased in MOS/LSI dynamic memory devices, the possibility of obtaining acceptable yields of good electrical bars per slice decreases. A 64K bit dynamic RAM may be manufactured efficiently at low cost, but perhaps a 256K bit device cannot. For this reason, various methods of rendering the devices "fault tolerant" have been devised. Typically, redundant cells are included, and some mechanism is provided for substituting the redundant cells when bad cells are addressed. Various circuits for performing this substitution are set forth in U.S. Pat. Nos. 4,051,354 and 4,047,163, issued to Wm. C. Choate et al and assigned to Texas Instruments. Fault tolerant memory devices of this type may employ electrically programmable memory (EPROM) cells on the dynamic memory chip to store the addresses of bad cells or rows with bad cells. The EPROM cells most widely manufactured today are of the double level polysilicon floating gate type such as shown in U.S. Pat. No. 3,984,822 issued to Simko et al. The process used to make these devices is not sufficiently compatible with the process used to make typical dynamic RAMs, because the EPROM needs implants after first level poly and before second level poly to make connection to source/drain diffused regions.

It is the principal object of this invention to provide a method of making EPROM cells which is compatible with a standard process for making dynamic RAM cells. Another object is to provide an improved method of making fault tolerant memory devices. A further object is to provide an improved electrically programmable memory device.

SUMMARY OF THE INVENTION

In accordance with an illustrative embodiment of the invention, a fault tolerant memory device includes an array of rows and columns of dynamic random access memory cells and a set of EPROM cells of the floating gate type laid out with the same pitch, one aligned with each row, to store the identify of rows having bad cells. The EPROM cells are formed in preferred manner which permits them to be made with a standard N-channel process, and allows the row lines of the RAM and control gate connections to the EPROM cells to be of the same spacing.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompany drawings, wherein:

FIG. 4 is a greatly enlarged plan view of a small part of a semiconductor chip showing the EPROM cell of the invention;

FIGS. 5a-5c are elevation views in section of the cell of FIG. 4, taken along the lines a—a, b—b, and c—c, respectively, in FIG. 4;

DETAILED DESCRIPTION OF SPECIFIC EMBODIMENT

Figure 1:
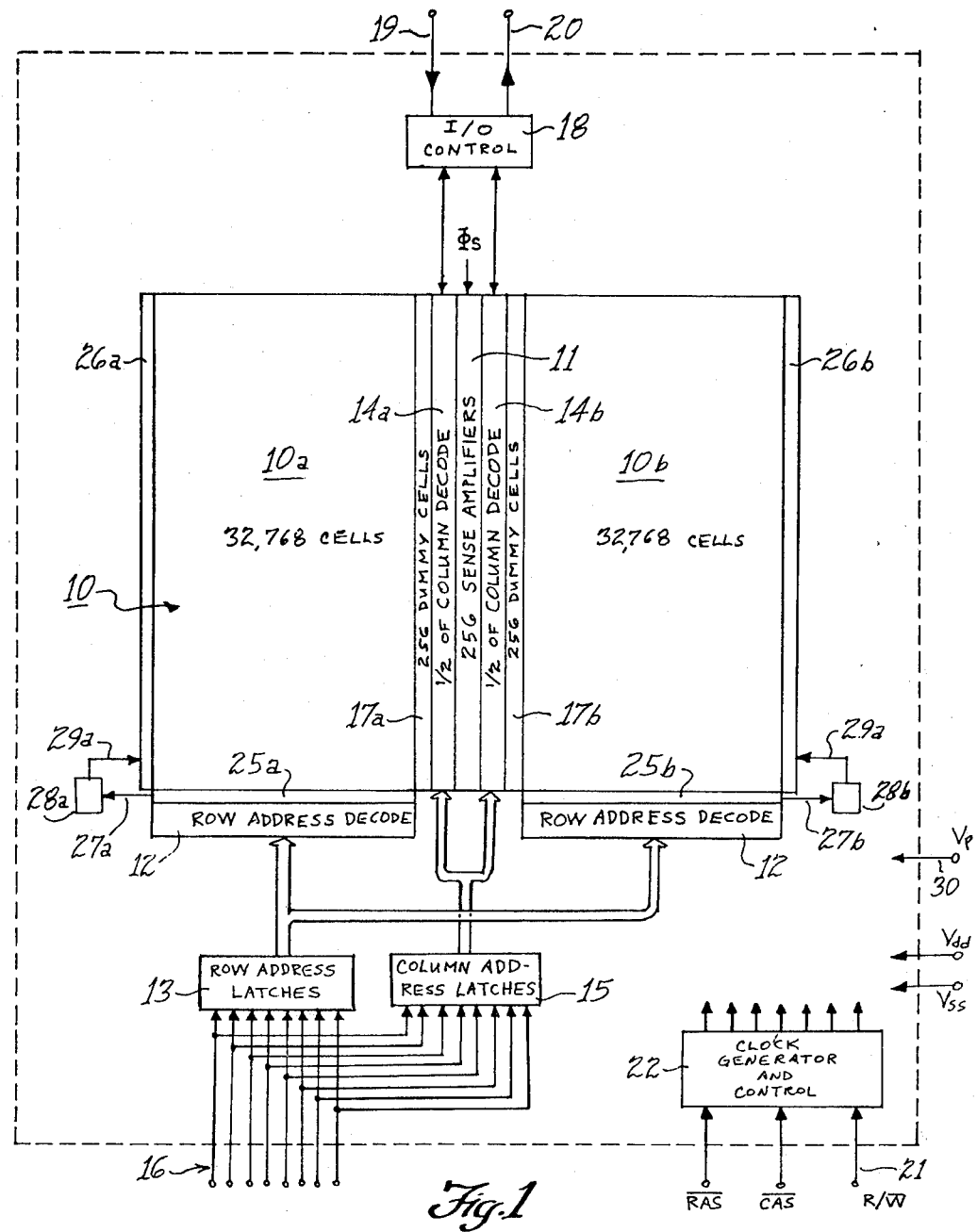
FIG. 1 is a block diagram of a memory device formed in a semiconductor chip, using EPROM cells made according to the invention.
Figure 2:
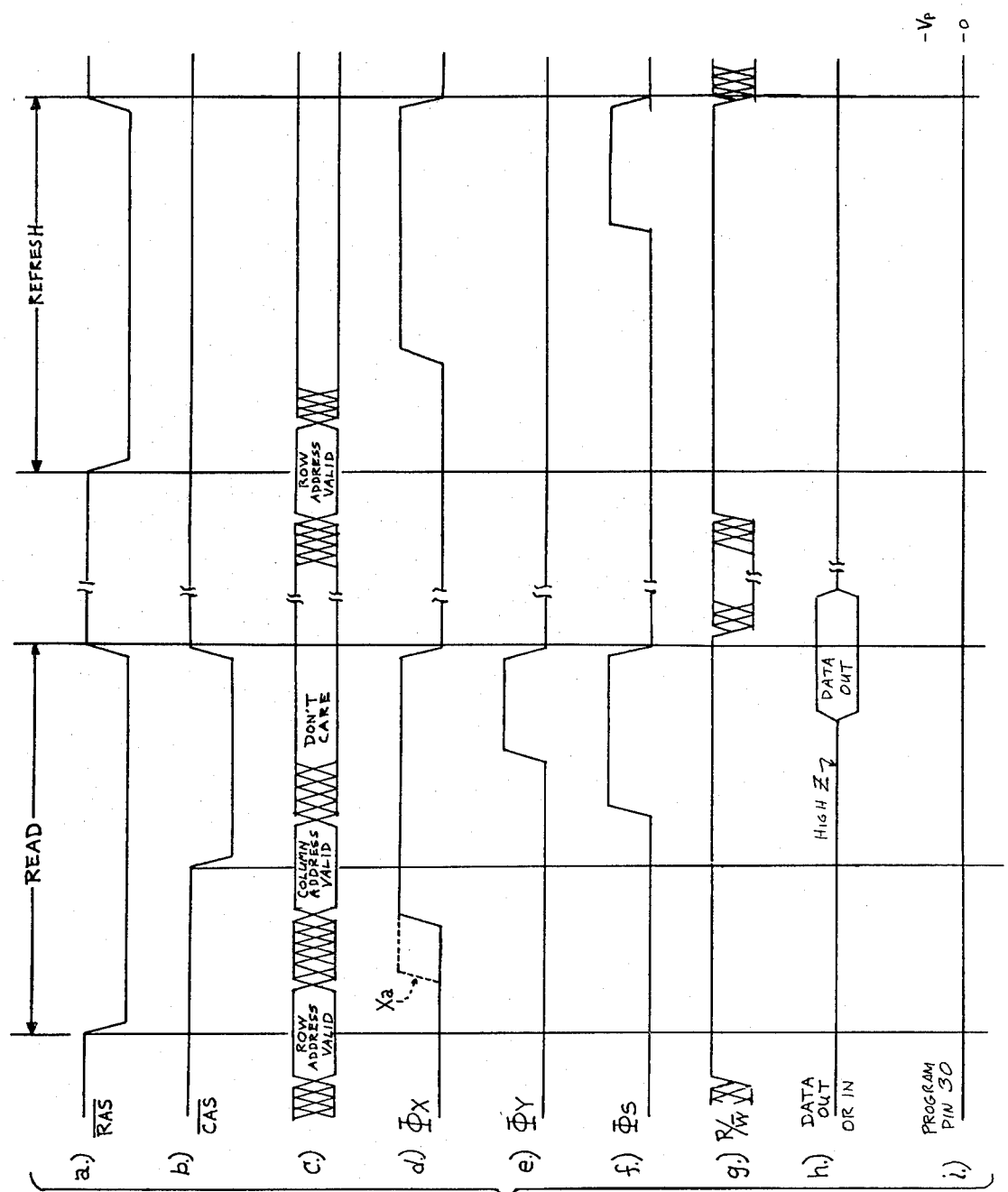
FIGS. 2a-2i are graphs of voltage vs. time for electrical waveforms or events occurring in the device of FIG. 1.
Figure 2:
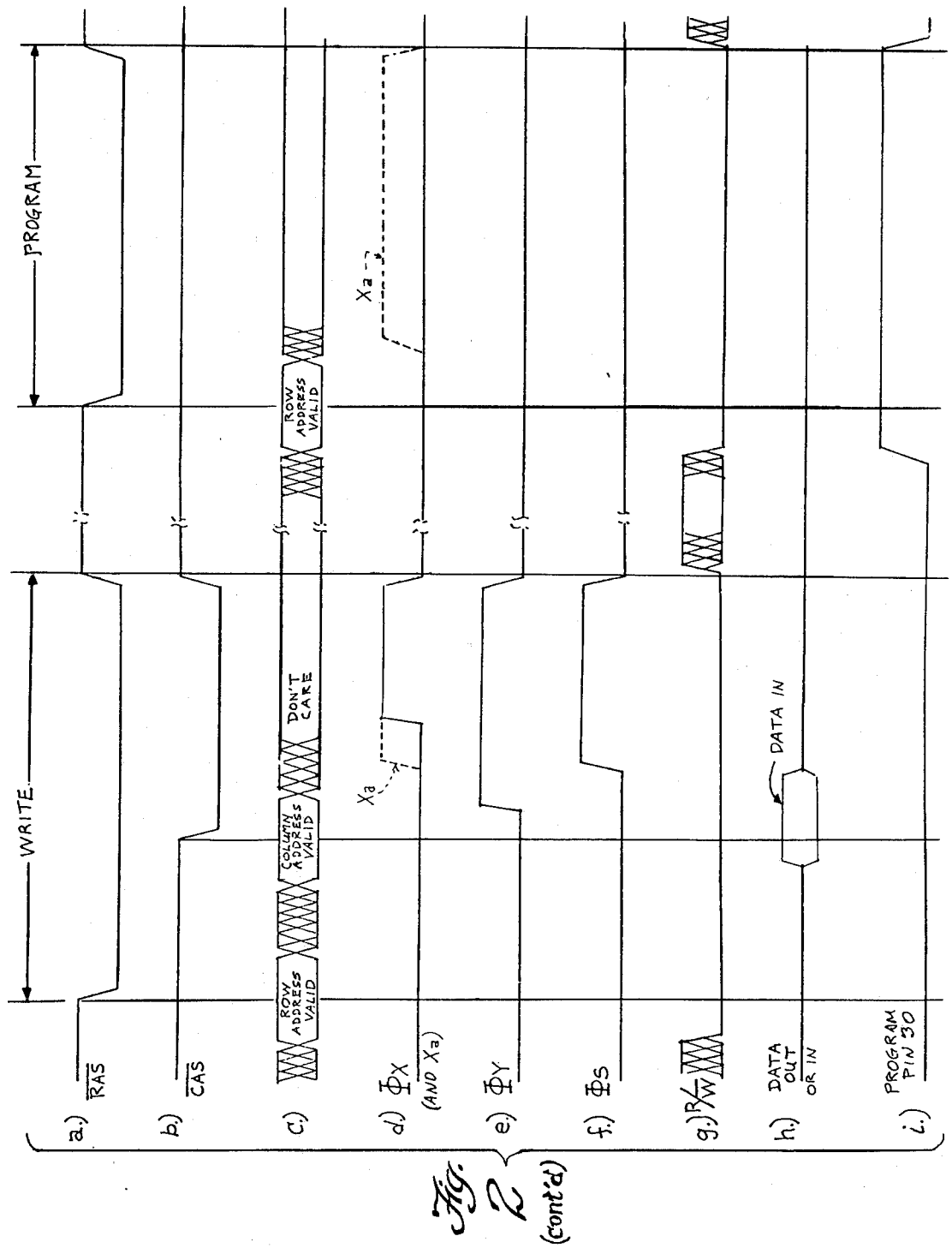

Referring to FIG. 1, a fault tolerant memory device is shown which may use the EPROM cells of the invention. The device has an array 10 of 256 rows and 256 columns of memory cells, totalling 65,536 cells in this example. The size of the memory array is of course immaterial. The cell array is split into two halves 10a and 10b, each containing 32,268 cells, and one of a set of 256 sense amplifiers 11 is connected at the center of each column line. A row decoder 12 is connected to the 256 row lines and selects one row line based on an 8-bit address in row address latches 13. A column decoder selects one-of-256 columns based on an 8-bit address in column address latches 15; the column decoder is typically split into two halves, 14a and 14b, which are physically positioned beside the sense amplifiers 11 between the halves 10a, 10b of the cell array. The row and column addresses are multiplexed into the chip via eight address pins 16. A row address strobe signal $\overline{RAS}$ seen in FIG. 2a causes the latches 13 to accept the 8-bit address then on the pins 16 as seen in FIG. 2c. Likewise, a column address strobe signal $\overline{CAS}$ seen in FIG. 2b causes the latches 15 to accept the address from the pins 16, also seen in FIG. 2c. A row of dummy cells 17a and 17b is positioned on each side of the sense amplifiers; when a row in the array half 10a is addressed then the row 17b of dummy cells on the opposite side is addressed, or vice versa. An address is applied to one of the rows at $\Phi X$, seen in FIG. 2d, while the column address is applied at $\Phi Y$, seen in FIG. 2e; these are reversed in time sequence for read or write operations. The sense amplifiers 11 are operated at a time $\Phi S$, seen in FIG. 2f, occurring before $\Phi Y$ for read or after $\Phi Y$ for write. The selected column line is connected to an input/output control circuit 18 by the column decoders 14a, 14b, and thus to input pin 19 or output pin 20. R/w on 21 defines data is incoming or outgoing. A clock generator and control circuit 22 receives the $\overline{RAS}$ and $\overline{CAS}$ inputs, the R/$\overline{W}$ command, and other commands such as chip select $\overline{CS}$, chip enable $\overline{CE}$, etc., if used in a particular system, and generates the various clocks and commands needed to operate the device.

As thus far described, the memory device is of the type known in the industry. For example, this type of dynamic, random access, read/write memory is disclosed in Electronics, Sept. 28, 1978, pp. 109–116, or in similar form in Electronics, Sept. 13, 1973, at pp. 116–121; Feb. 19, 1976, at pp. 116–121, or May 13, 1976, at pp. 81–86.

To provide fault tolerant operation in the memory device of FIG. 1, a set of 256 EPROM cells 25a and 25b is included at one end of the array 10. Each EPROM cell is aligned with and directly connected to one of the rows, and functions to store information as to whether or not this row contains one or more memory cells which tested bad. A redundant row 26a or 26b is included on each side of the array 10, and each one is used only if its array half 10a or 10b contains a row with a bad cell as recorded in the EPROM cells 25a,25b. The redundant rows 26a,26b are identical to the standard rows of the array 10 and are connected to the 256 column lines in the same manner as the standard cells. The cells 25a,25b are connected to an output line 27a or 27b and a circuit 28a or 28b which generates voltage on a row line 29a or 29b for the redundant rows 26a or 26b only when the addressed row contains a bad cell. The EPROM cells 25a,25b are programmed by a high voltage Vp applied to a pin 30 during testing of the part. Data in various patterns is written in and read out of the device during test, and if bad data is obtained from one or more cells in a row then the EPROM cell for this row is programmed by applying a Vp voltage (about +25v) to the pin 30 while the row line for the bad row is addressed. This causes the floating gate of this cell to be charged by electrons, and thereafter the cell will have a high threshold and will not turn on when a logic level voltage, typically 5v, is applied to its control gate.

Figure 3:
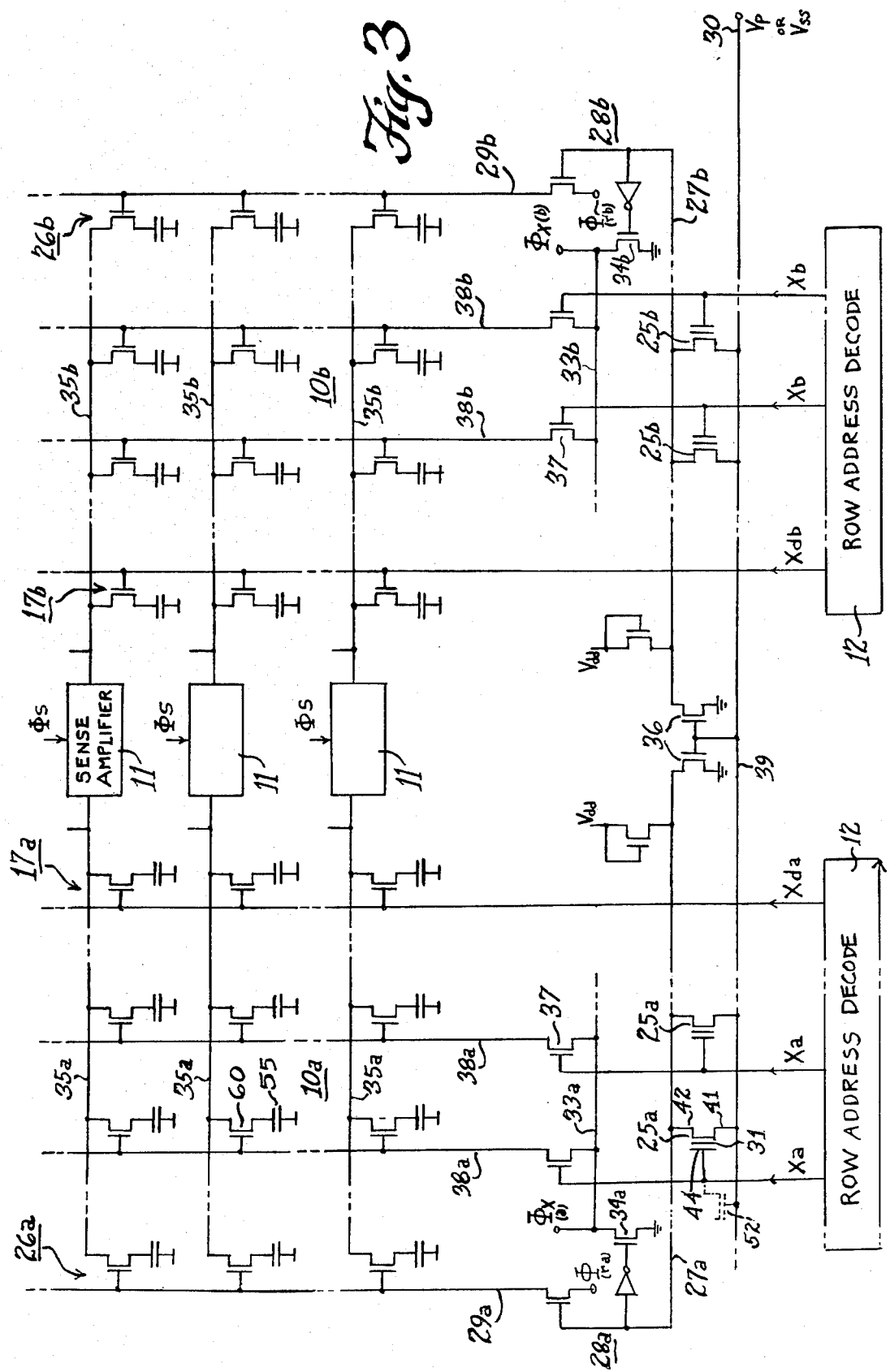
FIG. 3 is an electrical schematic diagram of a part of the cell array of the memory device of FIG. 1.

Turning to FIG. 3, a portion of the cell array 10 is shown in schematic form, with the EPROM cells 25a,25b and redundant rows 26a and 26b included. When the row decoder selects one of the Xa lines, for example, in array half 10a, then one Xa and the Xdb lines are activated so that when ΦX goes high one row line in 10a and the dummy row line 17b go high. If the EPROM cell 25a for this row does not have its floating gate 31 charged this EPROM cell will turn on, holding the line 27a low and preventing control circuit 28a from being activated. The line 29a stays low and the redundant row 26a is not activated. Dummy row line 17b is activated, and sensing occurs at ΦS, FIG. 2f. However, if the EPROM cell 25a for this row has its floating gate 31 charged, the EPROM cell will not conduct when the Xa line goes high and the line 27a goes high at ΦR, tripping the control 28a, bringing line 29a high and shorting a Φx line 33a to ground via transistor 34a. Thus, the cells from the redundant row 26a will be connected to the column line halves 35a on this side, so that when Φs occurs the differential sense amplifiers will sense the redundant cells from 10a and the dummy cell row 17b. During normal operation, the pin 30 is grounded; during programming this pin and line 39 are at ground except when a bad row is to be programmed out, then it is taken to Vp, about +25v. When the pin 30 goes high a pair of transistors 36 turn on so the lines 27a and 27b short the drains of the EPROM transistors 25a,25b to ground, as needed for programming. The controls 28a,28b are reset during the precharge cycle for the memory, between each refresh or read cycle.

In FIGS. 4 and 5a–5c, an EPROM cell 25a (or 25b) is shown according to the invention. This cell may be made by the standard N-channel, silicon gate, self-aligned, double level poly process as is used to make dynamic RAMs of the type now in volume production. A P-type silicon chip 40 has N+ source and drain regions 41 and 42 formed therein by diffusion or implant, using a segment 43 of second level poly as a mask. This segment 43 forms the floating gate 31 of the EPROM transistor, and also is coupled to a control gate 44 by an enlarged area 45. The control gate 44 is formed by first level poly and extends along the face of the chip over thick field oxide 46 to transistor 37 for one of the row lines 38a (or 38b) which would be metal in a typical dynamic RAM construction. Metal lines which form the lines 27a or 27b and the line 39 connected to the programming pin 30 are both connected to the source or drain regions 41 and 42 by metal-to-moat contacts 47. Thin thermal oxide layer 48 forms the gate insulator for the transistor 25a, and a thermal oxide coating 49 insulates the first level poly control gate from the second level poly floating gate. A deposited interlevel oxide coating 50 insulates the polysilicon from the metal conductors.

The area 45 of the polysilicon segment 43 may be large compared to the active area of the floating gate 31 to provide an efficient coupling ratio. The floating gate in a standard stacked gate EPROM cell shields the channel from the control gate so the only mechanism by which the control gate can influence the conduction in the channel is by capacitively coupling a voltage to the floating gate; thus it does not matter whether the control gate is on top of the channel or not, merely that it is capacitively coupled to the floating gate. Also, it does not matter whether the control gate is over or under the floating gate when it is laterally spaced from the channel.

A process for making the EPROM cell of the invention at the same time and with the same process as a standard RAM cell will be described with reference to FIGS. 6a–6d. The starting material is a P- substrate 40 having a concentration of about $10^{15}$per cm$^3$. After clean-up a thin thermal oxide coating 51 is grown to about 1000Å.

Figure 6:
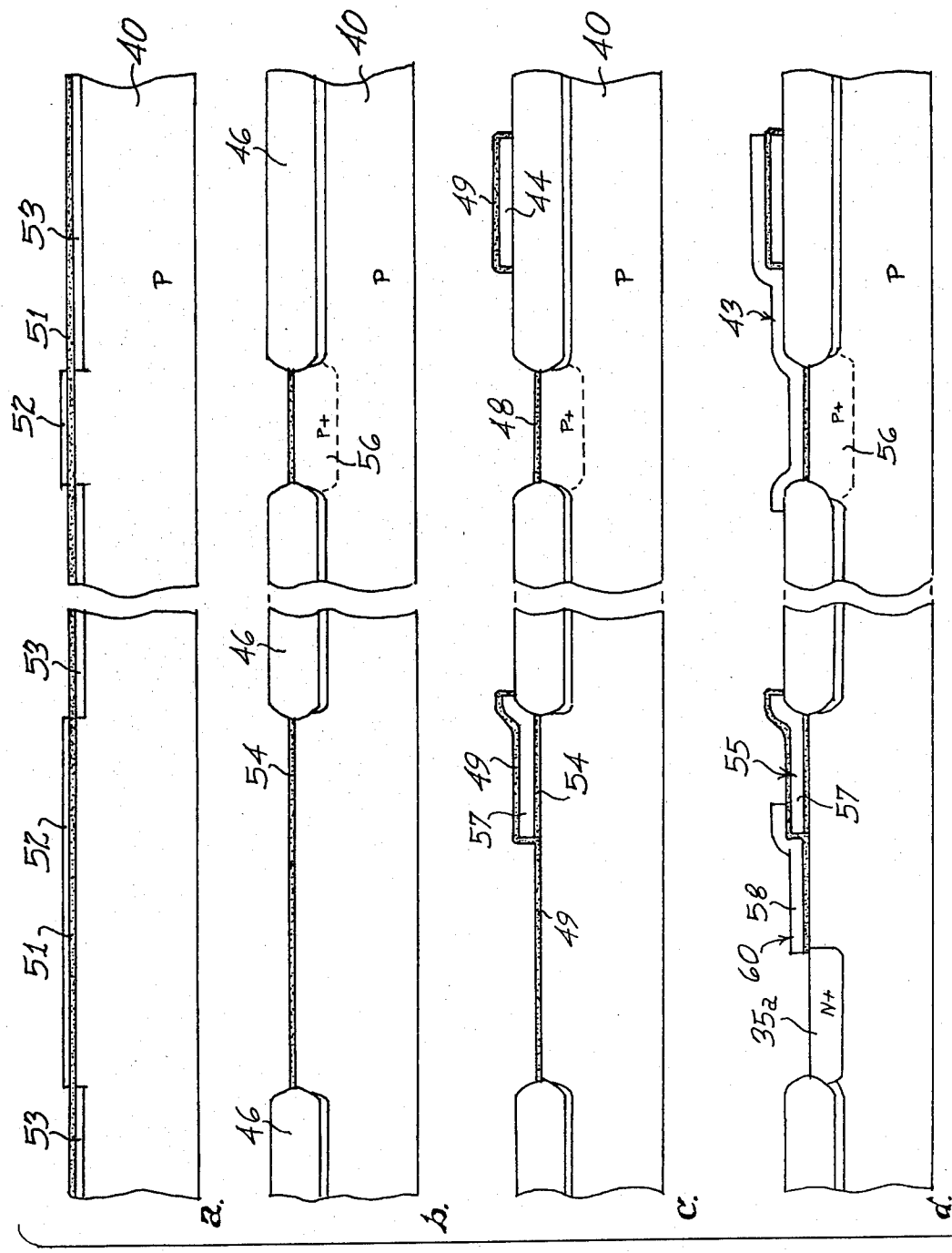
FIGS. 6a-6d are elevation views in section of the cell array of FIGS. 4 and 5a-5c, and a dynamic RAM cell, at successive stages in the manufacturing process, taken generally along the line a—a in FIG. 4.

The next step of the process as seen in FIG. 6a is deposition of 1000Å of silicon nitride 52 which is then patterned to remove nitride where field oxide is to be grown, an "inverse moat" pattern. A boron implant produces regions 53 which will become the channel stops. Turning now to FIG. 6b, field oxide 46 is grown in areas not covered by nitride 52, then the nitride and oxide 51 are removed and a new thin oxide 54 grown to provide the gate insulator for the capacitor 55 in the memory cell. If a P+ tank is needed for programming efficiency, it is created at this point by using a photoresist implant mask to cover everything except the areas of the EPROM cells, then performing a boron implant which after drive-in produces the P+ tank 56. A first polycrystalline silicon layer is now deposited, doped N+ and patterned to define the control gate 44 and the upper plates 57 of the capacitors 55 in the memory cell array 10a,10b, then a thermal oxide coating 49 is grown over the first level poly, as seen in FIG. 6c. When the thermal oxide 49 is grown over the first polysilicon, the gate oxide 48 for the EPROM transistor is formed at the same time, as well as the gate oxide 49 for the storage cell transistor on the left.

Referring to FIG. 6d, a second level of polysilicon is deposited and patterned to define segment 43 of the EPROM cells and the gates 58 of the transistors 60 of the cell array 10a,10b after which an arsenic implant (using the second poly and oxide 49 as a mask) and diffusion defines the N+ regions which create the column lines 35a,35b in the cell array as well as the N+ source and drain regions 41,42 of the EPROM cells 25a,25b. This step also dopes the 2nd poly N+. Interlevel oxide 50 is deposited and patterned, then aluminum for lines 38a,38b contacting the gates 58, the lines 27a,27b,39 as well as other interconnections.

In double level polysilicon process where the first level poly is used as the N+ implant or diffusion mask, as described in copending application Ser. No. 042,846, assigned to Texas Instruments, the control gate 44 would be on top of the floating gate 31.

The EPROM cell 25a made according to the invention is programmed by applying a high voltage Vp across the source-drain path 41-42 while applying a positive voltage to the gate control gate 44. Programming efficiency is enhanced by forming a gated capacitor 52 between the line 39 and each control gate 44 so that when the line 39 goes to Vp the gate 44 (if it has a logic 1 thereon, i.e., if it is the row selected by the row decoder 12) will be boosted to near Vp; other non-selected cells 25a or 25b will be unaffected.

Figure 7:
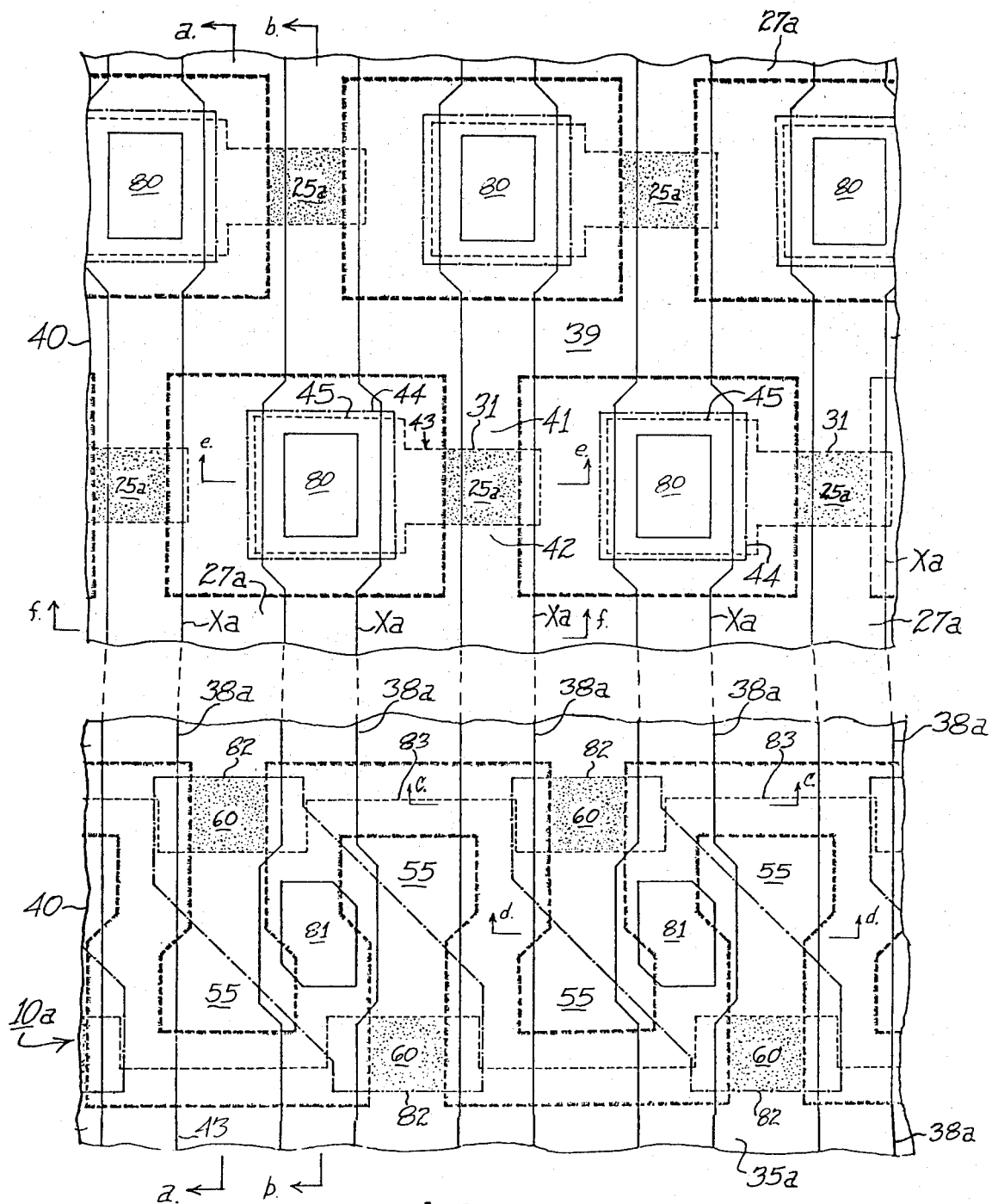
FIG. 7 is a greatly enlarged plan view of a small part of a semiconductor memory array according to one embodiment of the invention.
Figure 8:
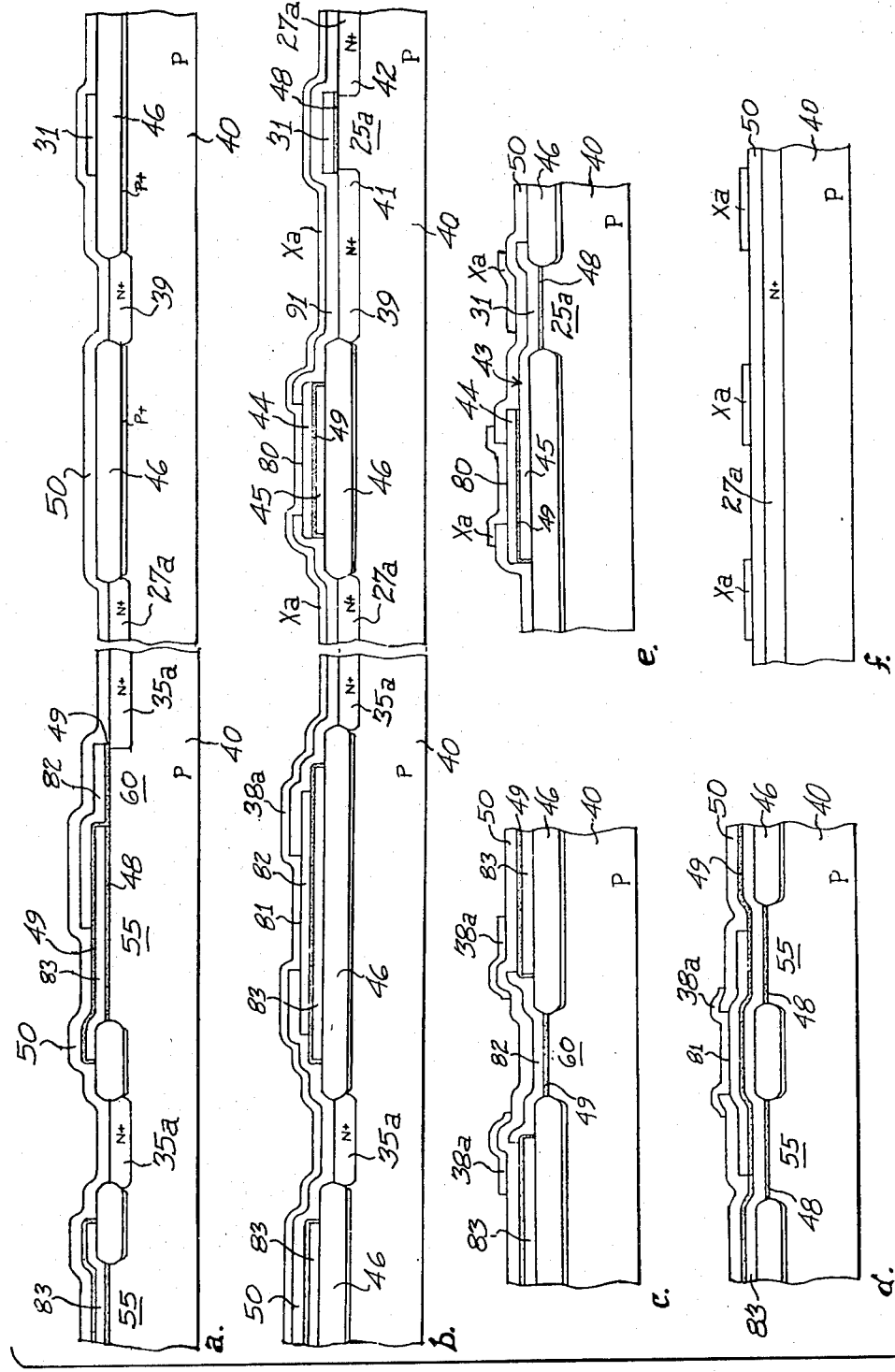
FIGS. 8a-8f are elevation views in section of the device of FIG. 7, taken along the lines a—a to f—f in FIG. 7.

Referring to FIG. 7 and the sectional views of FIGS. 8a-8f, the EPROM cells of the invention are shown in a physical layout in a semiconductor chip 40 wherein the metal row lines 38a of the RAM array 10a are aligned with and of the same pitch as the metal lines Xa making contact to the control gates 44 in the column of EPROM cells. Each metal line is a continuous strip forming an Xa line in the EPROM column and also forming a row line 38a in the RAM. A metal-to-poly contact area 80 makes connection to the control gate 44 as seen in section in FIGS. 8b and 8e. A metal-to-poly contact area 81 makes connection to a second-level polysilicon segment 82 which creates the gate of a pair of adjacent transistors 60 in the array. The contacts 81 alternate in physical placement so only two of the contacts 81 are seen in FIG. 7; the contacts 81 for the other three metal strips 38a seen in FIG. 7 are in the next column below the one seen, where the layout is exactly repeated except offset by the width of pitch of rows. The capacitors 55 are created in moat areas (half dumbell shaped in FIG. 7) over which extends a first level poly strip 83. Each strip 83 is of zig-zag shape and extends the length of a column to connect to a Vdd supply for biasing the capacitors. The column lines 35a are N+ diffused moat regions extending the length of a column. In the EPROM column, the ground line 39 is an N+ diffused moat region, as are the two column lines 27a which together form one output line. The floating gate 31 is part of a segment 43 composed of first-level polysilicon, a part 45 of which underlies the second-level poly control gate 44. This part 45 is spaced away from the first-level poly at the channel region. In this manner, when the N+ implant or diffusion is made to form the source regions and column lines 35a of the RAM, the source mask and same step forms the lines 39 and 27a along with the source and drain regions 41 and 42 of the EPROM. By performing a P implant using the same mask (but covering the RAM array with another photoresist operation), the P+ tank implant 56 traditionally used in EPROMs may be dispensed with, so the process becomes more nearly compatible with standard dynamic RAM processing. Then, double diffusion (P-type diffusing faster) creates P regions ahead of the source and drain. Gate oxide 48 and interlevel oxide 49 are the same as in FIGS. 4 and 5a-5c, except in this case the gate oxide 48 for the EPROM cell is formed at the same time as gate oxide 48 for the capacitors 55 while the interlevel oxide 49 is formed at the same time as gate oxide 49 for the transistors 60. The field oxide 46 and multilevel oxide 50 are the same as in FIGS. 5a-5c.

Additionally, it has been found that a cell 55 can be programmed without employing a P+ tank 56 at all, nor its equivalent double diffused P region as mentioned above. The cells will program when constructed with exactly the same process steps used for a standard dynamic RAM array 10, albiet slower. The time needed to program the column of EPROM cells 25a with the row addresses of faulty cells is not critical, since it is done in the factory as part of the manufacturing sequence, not as part of normal operations in the field.

The EPROM cell of the invention may be used for purposes other than mapping in fault tolerant memorys as described. For example, in microprocessor devices of the type disclosed in U.S. Pat. No. 3,991,305, assigned to Texas Instruments, the number of input/output terminals may be altered (the function of a given pin changed between input and output) by EPROM cells which activate or deactivate various input and/or output buffers. Thus, microcomputer devices having a variety of different functions could be made in the same manufacturing line with the same masks, then the functions defined at the time of final test by electrical programming.

While this invention has been described with reference to illustrative embodiments, this description is not intended to be construed in a limiting sense. Various modifications of the invention will be apparent to persons skilled in the art upon reference to this description. It is therefore contemplated that the appended claims will cover any such modifications or embodiments as fall within the true scope of the invention.

What is claimed:

1. A fault tolerant semiconductor memory device formed in a face of a semiconductor body comprising: a data memory array at said face composed of rows and columns of read/write memory cells, and a plurality of programmable cells laid out at said face in rows of the same pitch as and aligned with said rows of the data memory array, each of the programmable cells being individually programmed to retain indefinitely an indication of a faulty cell present in the aligned row of memory cells, and at least one row of redundant cells for replacing one of said rows of memory cells containing a faulty cell in response to the programmable cell for such row being programmed.

2. A device according to claim 1 wherein said memory cells are one-transistor type dynamic read/write memory cells.

3. A device according to claim 1 wherein said programmable cells are floating gate type electrically programmable cells including floating gates partly over the current paths and partly beneath the row lines.

4. A semiconductor memory device comprising: a data memory array of rows and columns of one-transistor type dynamic read/write memory cells, and a plurality of columns of programmable cells laid out in rows of the same pitch as and aligned with said rows of the data memory, the programmable cells including row lines and current paths laterally spaced from the row lines, the programmable cells being floating gate type electrically programmable cells including floating gates partly over the current paths and partly beneath the row lines, and means to receive an address and to decode a part of said address to simultaneously activate for access one row line of the data memory array and the same one row line for the programmable cells.

5. A memory device according to claim 4 wherein said one row line in the form of an elongated continuous conductive strip is connected to the gate of a transistor in each memory cell for such row and is also connected to the control gate of a floating gate type transistor in each of the programmable cells in such row.

6. A memory device according to claim 5 wherein the row lines for adjacent rows are about the same distance apart as the width of each such row line.

7. A fault tolerant semiconductor memory formed in a face of a semiconductor body comprising: a data memory array of rows and columns of memory cells at said face; a plurality of substitute memory cells at said face aligned with the rows of the data memory array and having the same pitch; a plurality of row lines at said face each making connection to all memory cells and substitute cells in a row; fault-address storage means at said face including at least one column of programmable cells aligned with said rows of the data memory array and having the same pitch; each programmable cell being connected to one of the row lines and including a current path spaced from the row line; means at said face to receive an address and to select one of said rows for access based on said address and at the same time to select said row line in the fault-address storage means; means at said face to connect an output from the data memory array to an output means of the device if the selected part of the fault-address storage means does not indicate a fault at the selected location or to connect an output from the substitute memory cells to said output means if the selected part of the fault-address storage means does indicate a fault at the addressed location.

8. A device according to claim 7 wherein said memory cells are read/write memory cells, the substitute memory cells are a column of read/write memory cells, the programmable cells are floating gate type field-effect transistors, and each row line is a continuous conductive strip crossing the memory array and the programmable cells.

9. A fault tolerant memory device formed in a face of a semiconductor body comprising an array of rows and columns of memory cells at said face of the semiconductor body, means at said face for addressing locations in the array, at least one row or column of redundant cells at said face and means at said face for accessing said redundant cells when defective cells are at the location addressed in the array, and a plurality of electrically programmable elements at said face aligned with said rows of memory cells for storing the locations of said defective cells, each of said elements having a plurality of conductive layers in each of said memory cells, row lines connected to rows of cells in said array and also extending across said programmable elements and making contact thereto.

10. A device according to claim 9 wherein the memory cells are dynamic read/write one-transistor cells and the conductive layers include two overlapping layers of polycrystalline silicon.

11. A device according to claim 10 wherein the electrically programmable elements are floating gate type EPROM cells each having two overlapping conductive layers forming a control gate and a floating gate.

12. A device according to claim 11 wherein each EPROM cell has a channel laterally spaced from the control gate.

* * * * *